United States Patent
Harada et al.

(12)

(10) Patent No.: US 9,543,189 B2
(45) Date of Patent: Jan. 10, 2017

(54) LAMINATED WAFER PROCESSING METHOD

(71) Applicant: DISCO CORPORATION, Tokyo (JP)

(72) Inventors: Seiji Harada, Tokyo (JP); Satoshi Kobayashi, Tokyo (JP); Yasuyoshi Yubira, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/445,608

(22) Filed: Jul. 29, 2014

(65) Prior Publication Data

US 2015/0037962 A1 Feb. 5, 2015

(30) Foreign Application Priority Data

Aug. 2, 2013 (JP) .................................. 2013-161277

(51) Int. Cl.
| | |
|---|---|
| *H01L 21/84* | (2006.01) |
| *H01L 21/302* | (2006.01) |
| *B32B 37/18* | (2006.01) |
| *B29C 65/16* | (2006.01) |
| *H01L 21/762* | (2006.01) |
| *H01L 21/268* | (2006.01) |

(52) U.S. Cl.
CPC ....... *H01L 21/76251* (2013.01); *H01L 21/268* (2013.01)

(58) Field of Classification Search
None
See application file for complete search history.

(56) References Cited

U.S. PATENT DOCUMENTS

| | | | | |
|---|---|---|---|---|
| 6,323,108 | B1* | 11/2001 | Kub | ................. H01L 21/76254 257/E21.568 |
| 6,605,518 | B1* | 8/2003 | Ohmi | ................ H01L 21/76259 257/E21.57 |
| 2003/0008437 | A1* | 1/2003 | Inoue et al. | ................. 438/149 |
| 2005/0239267 | A1* | 10/2005 | Tobashi | ............ H01L 21/76259 438/455 |

FOREIGN PATENT DOCUMENTS

JP 05-211128 8/1993

* cited by examiner

*Primary Examiner* — Pamela E Perkins
(74) *Attorney, Agent, or Firm* — Greer Burns & Crain Ltd.

(57) ABSTRACT

A method of processing a laminated wafer in which a first wafer is laminated on a second wafer, the method including: a laminated wafer forming step of forming the laminated wafer by laminating the first wafer on the second wafer; a modified layer forming step of forming a modified layer within the first wafer by positioning a focusing point of a laser beam within the first wafer and moving the first wafer in a horizontal direction relative to the focusing point while applying the laser beam, the modified layer forming step being performed before or after the laminated wafer forming step is performed; and a separating step of separating part of the first wafer from the laminated wafer with the modified layer as a boundary, the separating step being performed after the laminated wafer forming step and the modified layer forming step are performed.

11 Claims, 6 Drawing Sheets

US 9,543,189 B2

LAMINATED WAFER PROCESSING METHOD

BACKGROUND OF THE INVENTION

Field of the Invention

The present invention relates to a laminated wafer processing method.

Description of the Related Art

An SOI (Silicon On Insulator) wafer manufacturing method referred to as a hydrogen ion delamination method or the like is known (see Japanese Patent Laid-Open No. H05-211128, for example). In this manufacturing method, first, hydrogen ions or rare gas ions are implanted through an oxide film formed on a surface of a silicon wafer to form a fine bubble layer within the silicon wafer.

Next, the oxide film on the surface is brought into close contact with another silicon wafer serving as a substrate to form a laminated wafer constituted of the two silicon wafers. Thereafter, the laminated wafer is heated to cleave the silicon wafer at the fine bubble layer. A silicon thin film is thereby formed on the silicon wafer serving as a substrate with the oxide film interposed therebetween.

SUMMARY OF THE INVENTION

However, an ion implantation apparatus for implanting hydrogen ions or rare gas ions into the wafer is very expensive. Thus, with the above-described manufacturing method, cost involved in the manufacture of the SOI wafer may become too high.

It is accordingly an object of the present invention to provide a laminated wafer processing method that can reduce cost as compared with the conventional method.

In accordance with an aspect of the present invention, there is provided a method of processing a laminated wafer in which a first wafer is laminated on a second wafer, the method including: a laminated wafer forming step of forming the laminated wafer by laminating the first wafer on the second wafer; a modified layer forming step of forming a modified layer within the first wafer by positioning a focusing point of a laser beam within the first wafer and moving the first wafer in a horizontal direction relative to the focusing point while applying the laser beam, the modified layer forming step being performed before or after the laminated wafer forming step is performed; and a separating step of separating part of the first wafer from the laminated wafer with the modified layer as a boundary, the separating step being performed after the laminated wafer forming step and the modified layer forming step are performed.

Preferably, the modified layer has a predetermined thickness, and the method further includes a modified region removing step of removing a modified region remaining on the laminated wafer by applying at least one of grinding, polishing, and etching to the modified layer of the laminated wafer, the modified region removing step being performed after the separating step is performed.

Preferably, a remainder of the first wafer being left after the part of the first wafer being separated from the laminated wafer in the separating step is laminated on a third wafer to form a laminated wafer.

The laminated wafer processing method according to the present invention forms the modified layer within the first wafer by applying the laser beam, and thereafter separates part of the first wafer from the laminated wafer with the modified layer as a boundary. Thus, the laminated wafer can be processed without the use of a method such as an ion implantation requiring an expensive ion implantation apparatus or the like. Thus, cost can be reduced as compared with the conventional method using the ion implantation or the like.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
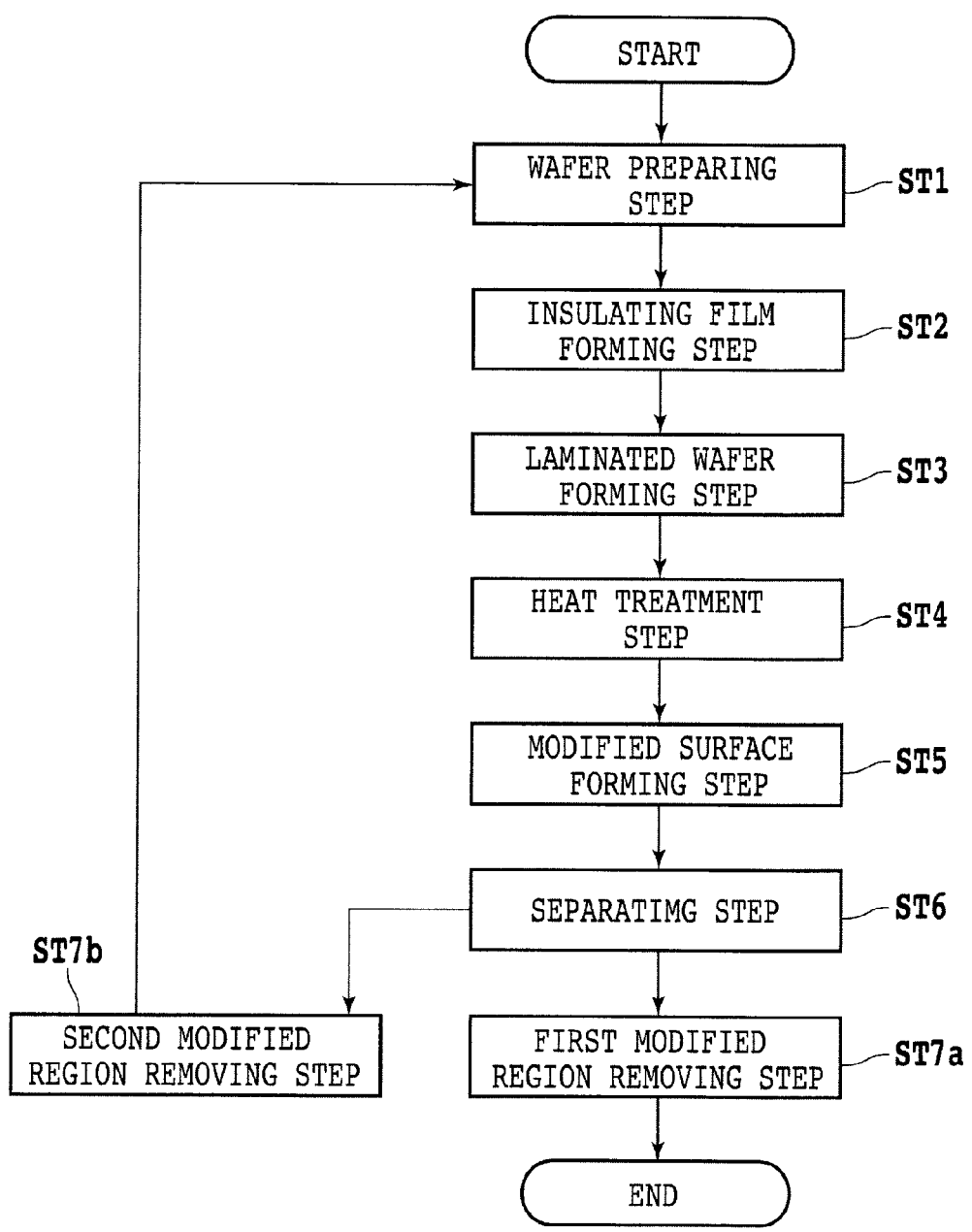
FIG. 1 is a diagram showing an outline of a laminated wafer processing method according to a present embodiment.

A preferred embodiment of the present invention will hereinafter be described with reference to the accompanying drawings. FIG. 1 is a diagram showing an outline of a laminated wafer processing method according to the present embodiment. As shown in FIG. 1, the laminated wafer processing method according to the present embodiment includes a wafer preparing step ST1, an insulating film forming step ST2, a laminated wafer forming step ST3, a heat treatment step ST4, a modified layer forming step ST5, a separating step ST6, a first modified region removing step (modified region removing step) ST7a, and a second modified region removing step ST7b.

In the wafer preparing step ST1, two wafers used to form a laminated wafer are prepared. In the insulating film forming step ST2, an insulating film such as an oxide film or the like is formed on the front surface of one wafer. In the laminated wafer forming step ST3, the two wafers are laminated via the insulating film to form a laminated wafer. In the heat treatment step ST4, the laminated wafer is subjected to a heat treatment to increase the strength of the lamination. In the modified layer forming step ST5, the wafer is irradiated with a laser beam to be modified in a surface shape, and thus a modified layer serving as a boundary when the wafer is divided is formed. In the separating step ST6, the wafer is divided with the modified layer as a boundary. In the first modified region removing step ST7a and the second modified region removing step ST7b, modified regions remaining on the divided wafer are removed. The laminated wafer processing method according to the present embodiment will hereinafter be described in detail.

In the laminated wafer processing method according to the present embodiment, first, the wafer preparing step ST1 is performed in which a first wafer 11 (see FIG. 2) and a second wafer 13 (see FIG. 2) used to form a laminated wafer are prepared. The first wafer 11 is a semiconductor wafer formed of a semiconductor material such as silicon, silicon carbide, gallium nitride, or the like. The first wafer 11 has a flat front surface 11a and a flat back surface 11b. The first wafer 11 is divided in a thickness direction with a modified layer formed later as a boundary.

The second wafer 13 is a semiconductor wafer equivalent to the first wafer 11. The second wafer 13 functions as a substrate that supports the first wafer 11. However, the composition of the second wafer 13 is not particularly limited as long as the second wafer 13 has a flat front surface 13a suitable for lamination to the first wafer 11. For example, the second wafer 13 may be a transparent substrate formed of glass, quartz, or the like. Incidentally, the second wafer 13 preferably has a same diameter as the first wafer 11 or has a larger diameter than the first wafer 11 so that the second wafer 13 can support the entire surface of the first wafer 11.

After an end of the wafer preparing step ST1, the insulating film forming step ST2 is performed. In the insulating film forming step ST2, an oxide film 15 having a thickness of about 0.1 μm to 2.0 μm is formed on the front surface 13a of the second wafer 13 (see FIG. 2). The oxide film 15 is for example formed by heating the second wafer 13 at a temperature of 1000° C. to 1300° C. under an atmosphere of oxygen with an oxygen flow rate of 10 L/min. The oxide film 15 formed by this method is very flat, and is thus suitable for the lamination of the first wafer 11 and the second wafer 13. However, the insulating film formed on the front surface 13a of the second wafer 13 is not limited to the oxide film 15 formed by the above-described method. For example, the oxide film 15 may be formed by a method such as plasma CVD, sputtering, or the like. In addition, a nitride film, an oxynitride film, or the like may be formed in place of the oxide film 15.

Figure 2:
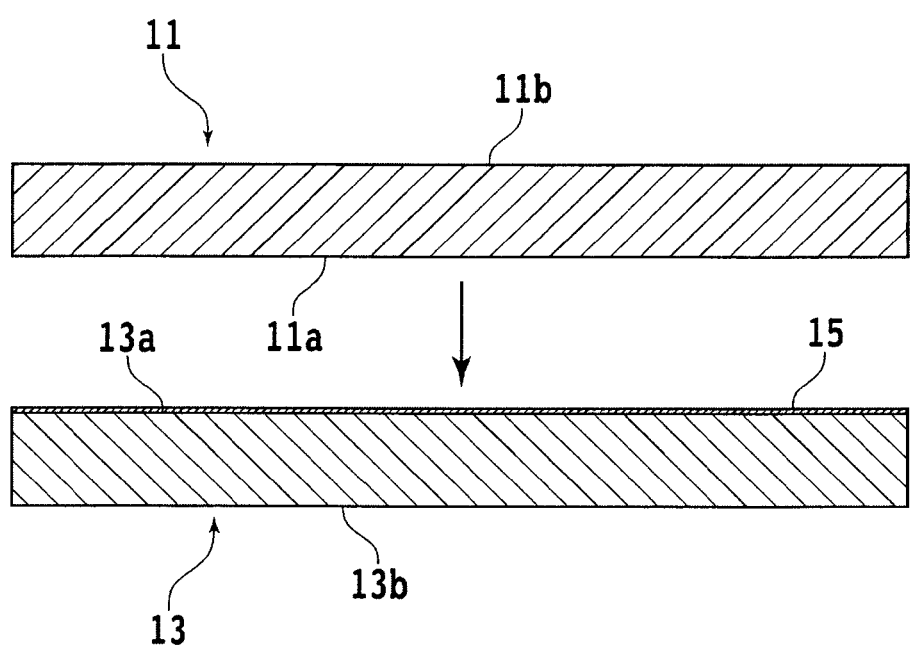
FIG. 2 is a sectional view schematically showing a laminated wafer forming step.

After the insulating film forming step ST2, the laminated wafer forming step ST3 is performed. FIG. 2 is a sectional view schematically showing the laminated wafer forming step ST3. In the laminated wafer forming step ST3, a laminated wafer 17 (see FIG. 3) is formed by bringing the first wafer 11 and the second wafer 13 into close contact with each other under an atmosphere at room temperature and atmospheric pressure. Specifically, as shown in FIG. 2, the front surface 13a of the second wafer 13 serving as a substrate and the front surface 11a of the first wafer 11 are opposed to each other, and the oxide film 15 formed on the second wafer 13 and the front surface 11a of the first wafer 11 are brought into contact with each other. Thereby, the oxide film 15 and the first wafer 11 are bonded to each other by an intermolecular force or the like, and thus the laminated wafer 17 in which the first wafer 11 is laminated on the second wafer 13 as a substrate can be formed.

In the present embodiment, the oxide film 15 and the front surface 11a of the first wafer 11 that are involved in the lamination are flat. Therefore, by bringing the oxide film 15 and the front surface 11a of the first wafer 11 into close contact with each other, the laminated wafer 17 can be formed as described above without an adhesive or the like being used.

After the laminated wafer forming step ST3, the heat treatment step ST4 is performed. In the heat treatment step ST4, the laminated wafer 17 is heated for 30 minutes to two hours at a temperature of 1000° C. to 1200° C. under an atmosphere of an inert gas, for example. This strengthens the bond between the oxide film 15 and the front surface 11a of the first wafer 11, and can therefore increase the strength of the lamination between the first wafer 11 and the second wafer 13.

Figure 3:
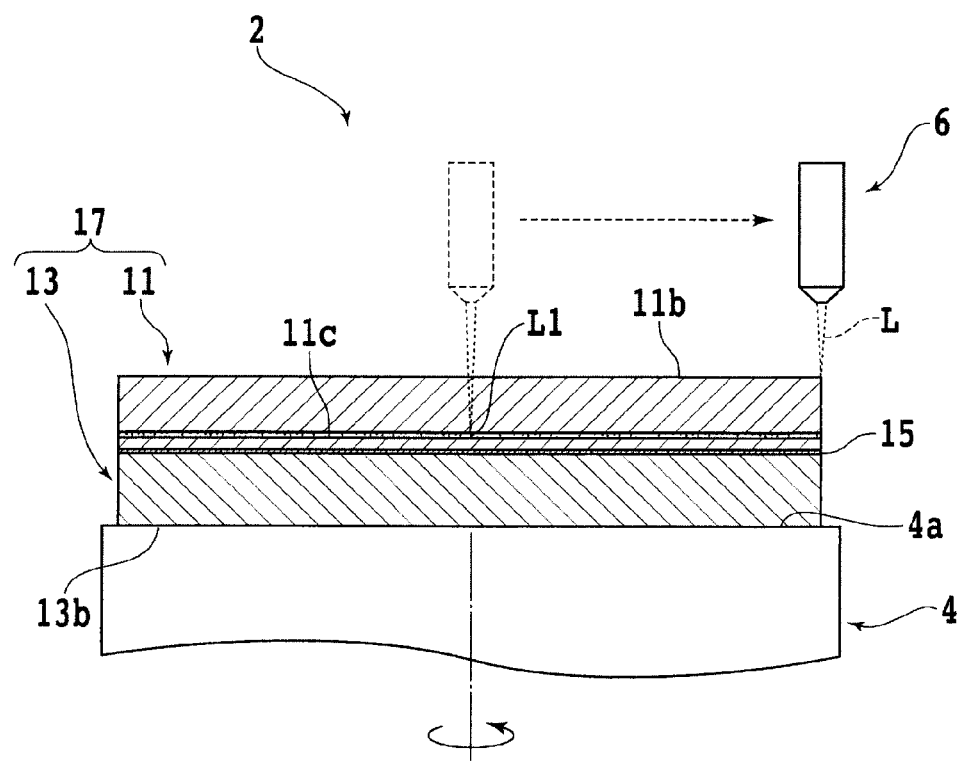
FIG. 3 is a partially sectional side view schematically showing a modified layer forming step.

After the heat treatment step ST4, the modified layer forming step ST5 is performed. FIG. 3 is a partially sectional side view schematically showing the modified layer forming step ST5. As shown in FIG. 3, in the modified layer forming step ST5, first, the laminated wafer 17 is held on a chuck table 4 of a processing apparatus 2 by suction. The chuck table 4 is moved in a horizontal direction by a moving mechanism (not shown), and is rotated about a vertical axis by a rotation-driving mechanism (not shown). The upper surface of the chuck table 4 is a holding surface 4a for holding the laminated wafer 17 by suction. The back surface 13b of the second wafer 13 is sucked by making the negative pressure of a suction source (not shown) act on the holding surface 4a.

Next, the chuck table 4 is moved to position the laminated wafer 17 below a laser beam irradiating mechanism 6. The laser beam irradiating mechanism 6 includes a laser oscillator (not shown) for oscillating a laser beam L and a condenser (not shown) for condensing the laser beam L.

After the laminated wafer 17 is positioned below the laser beam irradiating mechanism 6, the laser beam L having a wavelength that is not easily absorbed by the first wafer 11 is applied from the laser beam irradiating mechanism 6 to the first wafer 11. Here, a focusing point L1 of the laser beam L is positioned within the first wafer 11. In addition, the chuck table 4 is moved at a low speed in the horizontal direction parallel to the holding surface 4a while rotated about the vertical axis perpendicular to the holding surface 4a. That is, the chuck table 4 and the laser beam irradiating mechanism 6 are moved relative to each other in the direction parallel to the holding surface 4a (direction of the holding surface). Thereby, the focusing point L1 of the laser beam L moves so as to describe a spiral locus within a plane parallel to the holding surface 4a. Inside the first wafer 11, a modified layer or a modified region resulting from multiphoton absorption is formed around the focusing point L1 of the laser beam L. Therefore, a modified layer (planar modified region) 11c spreading across the first wafer 11 parallel to the holding surface 4a can be formed by moving the focusing point L1 of the laser beam L as described above.

Incidentally, the rotational speed and moving speed of the chuck table 4 are adjusted such that the modified layer 11c suitable for the division of the first wafer 11 can be formed. After the modified layer 11c having a predetermined thickness is formed throughout the first wafer 11, the modified layer forming step ST5 is ended.

Figure 4:
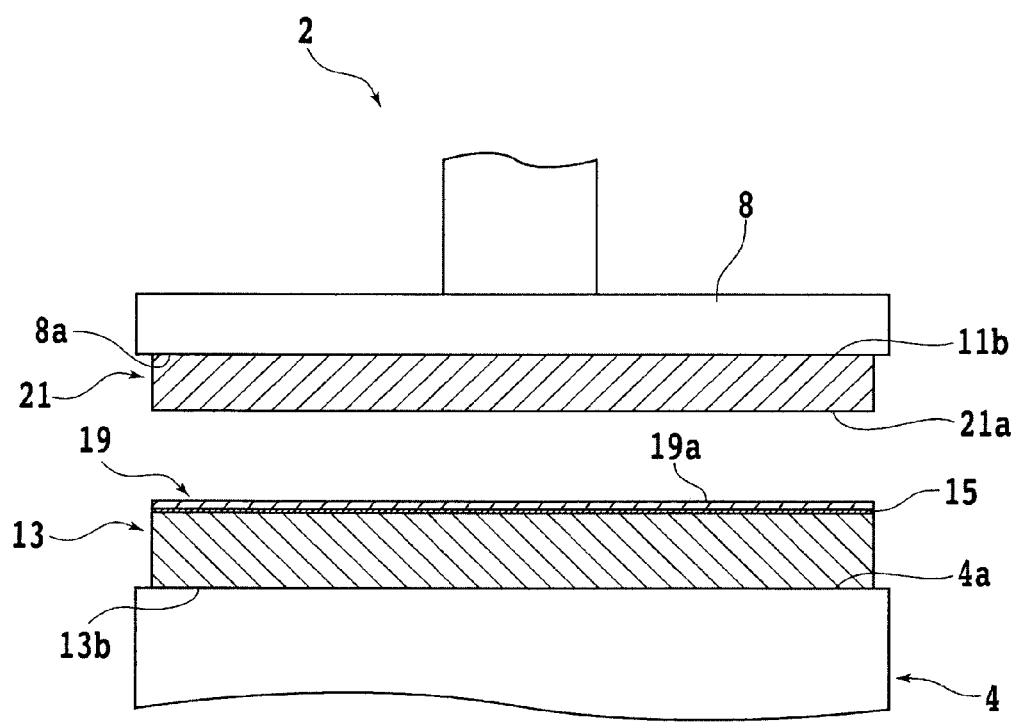
FIG. 4 is a partially sectional side view schematically showing a separating step.

After the modified layer forming step ST5, the separating step ST6 is performed. FIG. 4 is a partially sectional side view schematically showing the separating step ST6. In the separating step ST6, first, the chuck table 4 is moved to position the laminated wafer 17 below a separating mechanism 8 as shown in FIG. 4. The separating mechanism 8 has a suction surface 8a capable of sucking the laminated wafer 17, and is raised or lowered and rotated by a driving mechanism (not shown).

After the laminated wafer 17 is positioned below the separating mechanism 8, the separating mechanism 8 is lowered so that the separating mechanism 8 sucks the back surface 11b of the first wafer 11. After sucking the first wafer 11, the separating mechanism 8 is raised. The first wafer 11 is divided by a stress caused by the suction with the modified layer 11c as a boundary. The second wafer 13 is bonded to the front surface 11a side of the first wafer 11. Therefore, a semiconductor film 19 as part of the first wafer 11 remains on the second wafer 13. On the other hand, a separated wafer 21 as the other part of the first wafer 11 is separated and removed from the laminated wafer 17.

A modified region as part of the modified layer 11c remains on a separation surface 19a of the semiconductor film 19 and a separation surface 21a of the separated wafer 21. Accordingly, the first modified region removing step ST7a and the second modified region removing step ST7b for removing the modified regions are performed after the separating step ST6.

Figure 5:
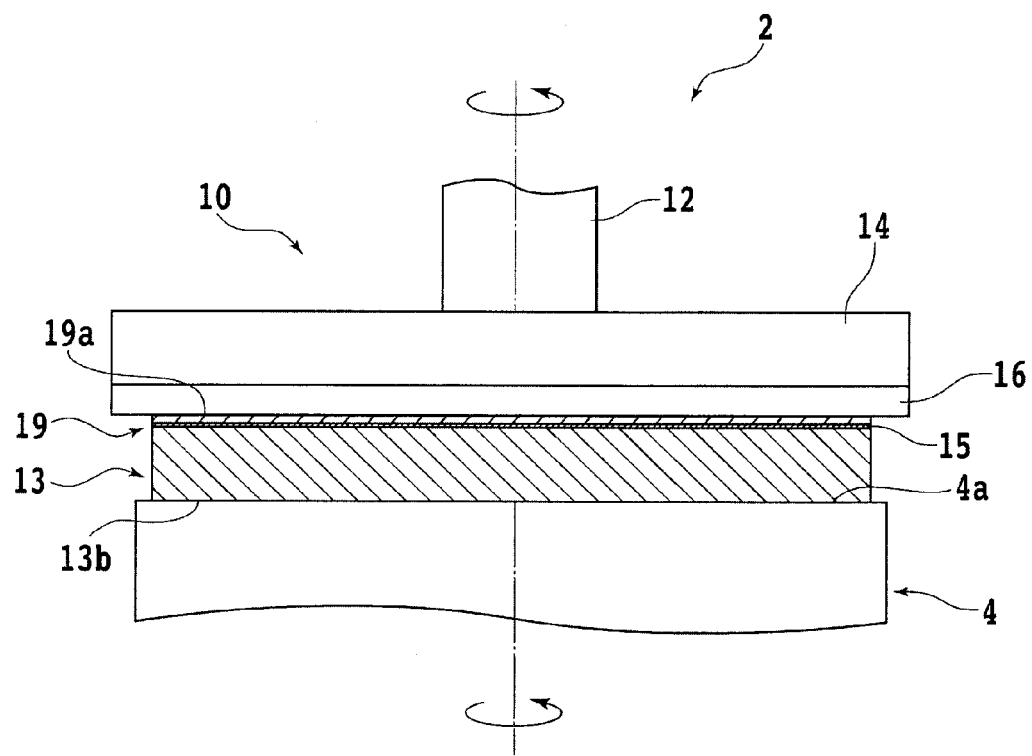
FIG. 5 is a partially sectional side view schematically showing a first modified region removing step.

FIG. 5 is a partially sectional side view schematically showing the first modified region removing step ST7a. In the first modified region removing step ST7a, first, the chuck table 4 is moved to position the semiconductor film 19 below a polishing mechanism 10. The polishing mechanism 10 has a rotatably supported spindle 12. The spindle 12 is moved in a vertical direction by a raising and lowering mechanism (not shown). A mount 14 having the shape of a disk is fixed to a lower end of the spindle 12, and a polishing pad 16 is mounted on an undersurface of the mount 14.

After the semiconductor film 19 is positioned below the polishing mechanism 10, as shown in FIG. 5, the chuck table 4 and the spindle 12 are rotated, and the spindle 12 is lowered by the raising and lowering mechanism to bring the polishing pad 16 into contact with the separation surface 19a of the semiconductor film 19. Thereby, the separation surface 19a of the semiconductor film 19 is polished, so that the remaining modified region can be removed. As a result of the above, an SOI wafer formed by the second wafer 13, the oxide film 15, and the semiconductor film 19 is completed.

Figure 6:
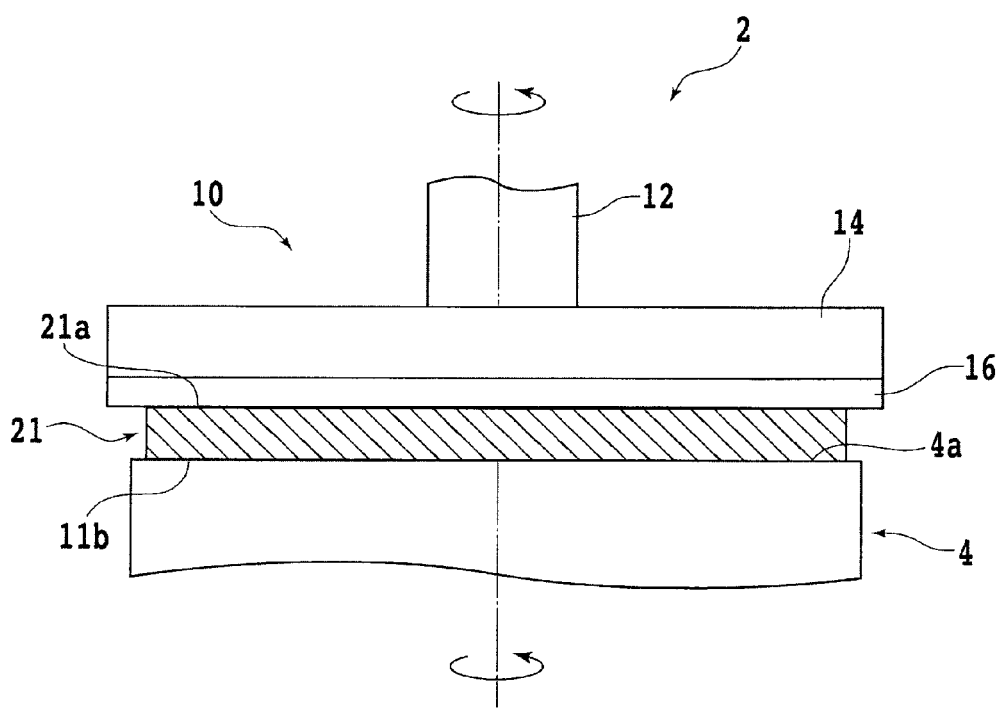
FIG. 6 is a partially sectional side view schematically showing a second modified region removing step.

FIG. 6 is a partially sectional side view schematically showing the second modified region removing step ST7b. In the second modified region removing step ST7b, first, the holding surface 4a of the chuck table 4 is made to suck a surface of the separated wafer 21 on an opposite side (back surface 11b of the first wafer 11) from the separation surface 21a. Then, the chuck table 4 is moved to position the separated wafer 21 below the polishing mechanism 10. Thereafter, as shown in FIG. 6, the chuck table 4 and the spindle 12 are rotated, and the spindle 12 is lowered by the raising and lowering mechanism (not shown) to bring the polishing pad 16 into contact with the separation surface 21a of the separated wafer 21. Thereby the separation surface 21a of the separated wafer 21 is polished, so that the remaining modified region can be removed.

The separated wafer 21 from which the modified region is removed can be reused as a first wafer 11. That is, a new SOI wafer can be formed by using the separated wafer 21 from which the modified region is removed as a first wafer 11, and repeating the steps shown in FIG. 1. Incidentally, in this case, a laminated wafer 17 is formed using, as a second wafer 13, a new third wafer (not shown) serving as a substrate.

As described above, the laminated wafer processing method according to the present embodiment forms the modified layer 11c within the first wafer 11 by applying the laser beam L, and thereafter separates part of the first wafer 11 from the laminated wafer 17 with the modified layer 11c as a boundary. Thus, the laminated wafer 17 can be processed without the use of a method such as an ion implantation requiring an expensive ion implantation apparatus or the like. Thus, cost can be reduced as compared with the conventional method using the ion implantation or the like.

Incidentally, the present invention is not limited to the description of the foregoing embodiment, but is susceptible of various changes. For example, in the foregoing embodiment, the modified layer forming step ST5 is performed after the laminated wafer forming step ST3. However, the present invention is not limited to this. It suffices to perform the modified layer forming step ST5 before the separating step ST6. Therefore, for example, the modified layer forming step ST5 may be performed before the laminated wafer forming step ST3.

In addition, in the foregoing embodiment, the semiconductor film 19 and the separated wafer 21 are polished to remove the remaining modified regions in the first modified region removing step ST7a and the second modified region removing step ST7b. However, the present invention is not limited to this. For example, the remaining modified regions can also be removed by a method such as grinding, etching, or the like.

In addition, in the foregoing embodiment, the oxide film 15 as an insulating film is formed on the front surface 13a of the second wafer 13. However, the insulating film may be formed on the front surface 11a of the first wafer 11, for example. In addition, the insulating film may be formed on both of the front surface 11a of the first wafer 11 and the front surface 13a of the second wafer 13.

In addition, in the foregoing embodiment, the first wafer 11 and the second wafer 13 are laminated without the use of an adhesive or the like. However, the first wafer 11 and the second wafer 13 can also be laminated by an adhesive or the like.

In addition, in the foregoing embodiment, the laser beam L is a single-spot laser beam. However, the laser beam L may be a multi-spot laser beam. For example, the first wafer 11 can be irradiated with a laser beam L formed by using a technology disclosed in Japanese Patent Laid-Open No. 2011-79044 or the like. The modified layer 11c can be formed in a short time by thus using a multi-spot laser beam as the laser beam L.

In addition, in the foregoing embodiment, the SOI wafer constituted of the second wafer 13, the oxide film 15, and the semiconductor film 19 is formed. However, the laminated wafer processing method according to the present invention can be used for other applications. For example, a laminated wafer of a new composition may be formed using, as the first wafer, a transparent substrate formed of quartz or the like.

In addition, in the foregoing embodiment, the modified layer forming step ST5, the separating step ST6, the first modified region removing step ST7a, and the second modified region removing step ST7b are performed in the common processing apparatus 2. However, these steps may be performed in different apparatuses.

In addition, in the foregoing embodiment, the first modified region removing step ST7a and the second modified region removing step ST7b are performed by using the common chuck table 4 and the common polishing mechanism 10. However, the chuck table and the polishing mechanism used in the first modified region removing step ST7a may be separate from the chuck table and the polishing mechanism used in the second modified region removing step ST7b.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a laminated wafer in which a first wafer is laminated on a second wafer, the method comprising:
   a laminated wafer forming step of forming the laminated wafer by laminating the first wafer on the second wafer via an insulating film selected from the group of an oxide film, a nitride film and an oxynitride film;

a modified layer forming step of forming a modified layer which is not exposed on a surface of the first wafer within the first wafer by positioning a focusing point of a laser beam within the first wafer and moving the first wafer in a horizontal direction relative to the focusing point while applying the laser beam, the modified layer forming step being performed before or after the laminated wafer forming step is performed; and a separating step of separating only part of the first wafer from the laminated wafer with the modified layer as a boundary, a remaining portion of the first wafer adjacent the insulating film having a predetermined thickness, the separating step being performed after the laminated wafer forming step and the modified layer forming step are performed, wherein the focusing point moves relative to the first wafer to describe a spiral locus within a plane.

2. The method of processing the laminated wafer according to claim 1, wherein the modified layer has a predetermined thickness, and the method further comprises a modified region removing step of removing a modified region remaining on the laminated wafer by applying at least one of grinding, polishing, and etching to the modified layer of the laminated wafer, the modified region removing step being performed after the separating step is performed.

3. The method of processing the laminated wafer according to claim 1, wherein a remainder of the first wafer being left after the part of the first wafer being separated from the laminated wafer in the separating step is laminated on a third wafer to form a laminated wafer.

4. The method of processing the laminated wafer according to claim 1, wherein the insulating film is formed on the surface of the first wafer and/or a surface of the second wafer by heating the first wafer and/or the second wafer.

5. The method of processing the laminated wafer according to claim 1, wherein the insulating film is formed by CVD or sputtering.

6. The method of processing the laminated wafer according to claim 1, wherein the insulating film is an oxide film formed by heating under an atmosphere of oxygen.

7. The method of processing the laminated wafer according to claim 1, wherein the first wafer and/or the second wafer is a transparent substrate.

8. The method of processing the laminated wafer according to claim 1, the method further comprises a heat treatment step of heating the laminated wafer, the heat treatment step being performed after the laminated wafer forming step is performed.

9. A method of processing a laminated wafer in which a first wafer is laminated on a second wafer, the method comprising:

a laminated wafer forming step of forming the laminated wafer by laminating the first wafer on the second wafer via an insulating film selected from the group of an oxide film, a nitride film and an oxynitride film;

a modified layer forming step of forming a modified layer which is not exposed on a surface of the first wafer within the first wafer by positioning a focusing point of a laser beam within the first wafer and moving the first wafer in a horizontal direction relative to the focusing point while applying the laser beam, the modified layer forming step being performed before or after the laminated wafer forming step is performed; and a separating step of separating only part of the first wafer from the laminated wafer with the modified layer as a boundary, a remaining portion of the first wafer adjacent the insulating film having a predetermined thickness, the separating step being performed after the laminated wafer forming step and the modified layer forming step are performed, wherein the laser beam is a multi-spot laser beam.

10. The method of processing the laminated wafer according to claim 1, wherein the laser beam is a multi-spot laser beam.

11. A method of processing a laminated wafer in which a first wafer is laminated on a second wafer, the method comprising:

a laminated wafer forming step of forming the laminated wafer by laminating the first wafer on the second wafer via an insulating film selected from the group of an oxide film, a nitride film and an oxynitride film;

a modified layer forming step of forming a modified layer which is not exposed on a surface of the first wafer within the first wafer by positioning a focusing point of a laser beam within the first wafer and moving the first wafer in a horizontal direction relative to the focusing point while applying the laser beam, the modified layer has a predetermined thickness, the modified layer forming step being performed before or after the laminated wafer forming step is performed; and a separating step of separating only part of the first wafer from the laminated wafer with the modified layer as a boundary, a remaining portion of the first wafer adjacent the insulating film having a predetermined thickness, the separating step being performed after the laminated wafer forming step and the modified layer forming step are performed;

a first modified region removing step of removing a modified region remaining on the laminated wafer by polishing to the modified layer of the laminated wafer using a chuck table and a polishing mechanism, the first modified region removing step being performed after the separating step is performed; and a second modified region removing step of removing a modified region remaining on a separated wafer as the other part of the first wafer by polishing to the modified layer of the separated wafer using another chuck table and another polishing mechanism, the second modified region removing step being performed after the separating step is performed.

* * * * *